(12) United States Patent
Inoue et al.

(10) Patent No.: US 6,525,385 B2
(45) Date of Patent: Feb. 25, 2003

(54) SEMICONDUCTOR DEVICE WITH INDUCTANCE ELEMENT

(75) Inventors: Tetsuo Inoue, Yokohama (JP); Takao Ito, Ohta-ku (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/891,270

(22) Filed: Jun. 27, 2001

(65) Prior Publication Data

US 2002/0000639 A1 Jan. 3, 2002

(30) Foreign Application Priority Data

Jun. 28, 2000 (JP) .......................................... 2000-194570

(51) Int. Cl.⁷ ............................................... H01L 43/00
(52) U.S. Cl. ........................ 257/421; 257/422; 257/108; 257/659
(58) Field of Search ................................ 257/108, 421, 257/422, 659, 660, 700, 728; 438/3, 48, 73, 308, 378

(56) References Cited

U.S. PATENT DOCUMENTS

| 5,068,714 A | * | 11/1991 | Seipler ...................... 156/273.3 |
| 5,572,478 A | * | 11/1996 | Sato et al. .................... 327/530 |
| 5,939,772 A | * | 8/1999 | Hurst et al. .................. 257/659 |
| 6,097,080 A | * | 8/2000 | Nakanishi et al. ........... 257/659 |

* cited by examiner

*Primary Examiner*—David Nelms
*Assistant Examiner*—Long Tran
(74) *Attorney, Agent, or Firm*—Oblon, Spivak, McClelland, Maier & Neustadt, P.C.

(57) ABSTRACT

A semiconductor device with an inductance element reduces eddy current in a conductive element and secures required inductance. The semiconductor device includes a semiconductor chip and the inductance element of flat structure formed on a surface of the semiconductor chip. The semiconductor chip is fixed to the conductive element, to form a package. The element has a magnetic material to face the semiconductor chip.

20 Claims, 11 Drawing Sheets

| MAGNETIC PERMEABILITY | $2 \times 10^4$ (0.01MHz)<br>$1 \times 10^4$ (0.1MHz)<br>$3 \times 10^3$ (1MHz)<br>$1 \times 10^3$ (10MHz) |
|---|---|
| THICK | 50 μm |

FIG.8

| DIAMETER | 750 μm |
|---|---|
| WIDTH | 6 μm |
| INTERVAL | 1 μm |
| TURNS | 26TURNS |
| THICK | 1 μm |
| INDUCTANCE | 500nH |

| PELLET | 480nH |
|---|---|
| FIG.6 | 476nH |
| FIG.2 | 349nH |

| MAGNETIC PERMEABILITY | 1100 |
|---|---|
| THICK | 1.5 $\mu$m × 4 layars |
| INSULATING LAYER | A$\ell$Nx (0.2 $\mu$m) |

| PELLET | 480nH |
|--------|-------|
| FIG.14 | 471nH |
| FIG.2  | 349nH |

SEMICONDUCTOR DEVICE WITH INDUCTANCE ELEMENT

CROSS REFERENCE TO RELATED APPLICATIONS

This application claims benefit of priority under 35 USC 119 to Japanese Patent Application No. P2000-194570 filed on Jun. 28, 2000, the entire contents of which are incorporated by reference herein.

BACKGROUND OF THE INVENTION

1. Field of the Invention

The present invention relates to a semiconductor device with an inductance element.

2. Description of Related Art

Conventional inductance elements are of core type or of shell type and employ combinations of coils and magnetic materials. These types of inductance elements became prevalent over monolithic inductance elements formed on ICs because the monolithic inductance elements i) must be bulky if required inductance is large and ii) must employ magnetic materials that are unsuitable for IC processes.

The reason why the inductance elements employ magnetic materials is because, when the inductance elements are energized, the magnetic materials effectively use magnetic flux to increase inductance.

Recent ICs, however, operate at high frequencies and require low inductance. Due to this and to make devices compact, there are requirements of integrally forming inductance elements on ICs or fabricating multi-chip modules including inductance elements.

Figure 1A:
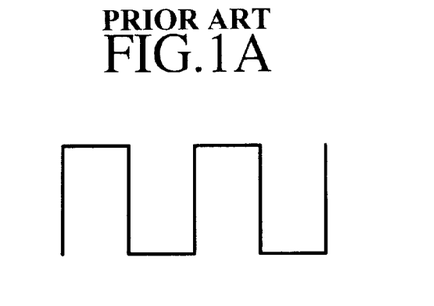
FIG. 1A is a plan view showing a meander coil serving as an inductance element.
Figure 1B:
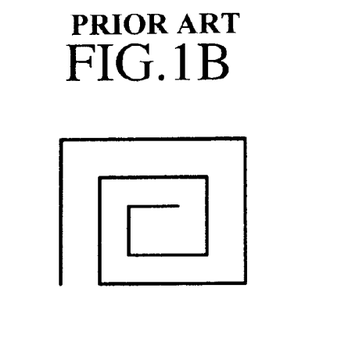
FIG. 1B is a plan view showing a spiral coil serving as an inductance element.

To form inductance elements on ICs, it is preferable to make the inductance elements with flat coils such as a meander coil of FIG. 1A and a spiral coil of FIG. 1B. Compared with multilayer coils, the flat coils involve ignorable contact resistance or via resistance and are easy to design.

Figure 2:
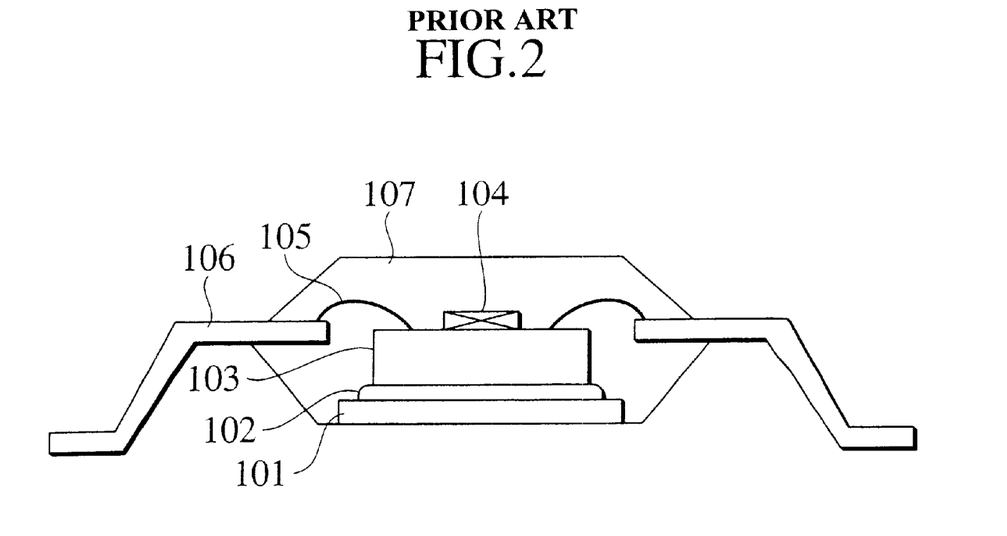
FIG. 2 is a sectional view showing a resin-sealed semiconductor device with an inductance element.
Figure 3:
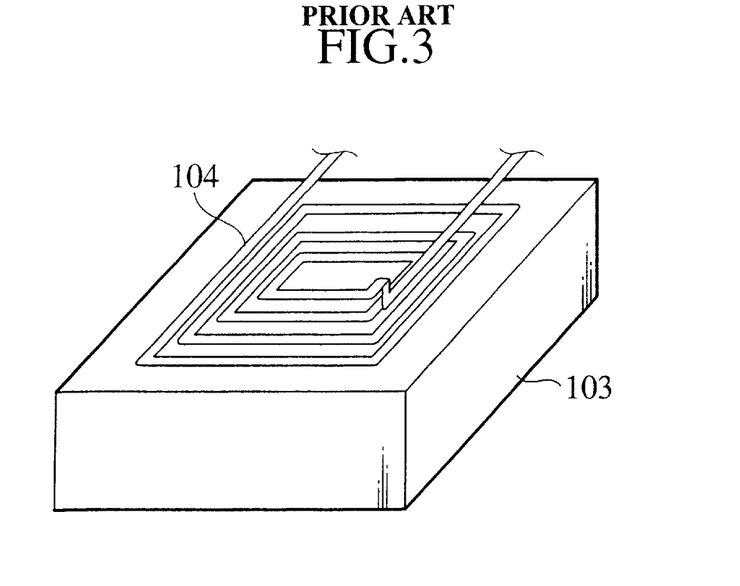
FIG. 3 is an enlarged view showing the inductance element and semiconductor chip of the device of FIG. 2.

FIG. 2 is a sectional view showing a resin-sealed semiconductor-device having an inductance element. This device has a conductive bed 101, a mount 102 laid on the bed 101, and a semiconductor chip 103 fixed to the mount 102. A principal plane of the chip 103 has the inductance element 104 made of a spiral coil. FIG. 3 is an enlarged view showing the inductance element 104 on the chip 103. Electrodes of the chip 103 are connected to leads 106 through bonding wires 105. The chip 103, leads 106, and wires 105 are consolidated with resin 107 into a package with the leads 106 partly extending outside.

Figure 4:
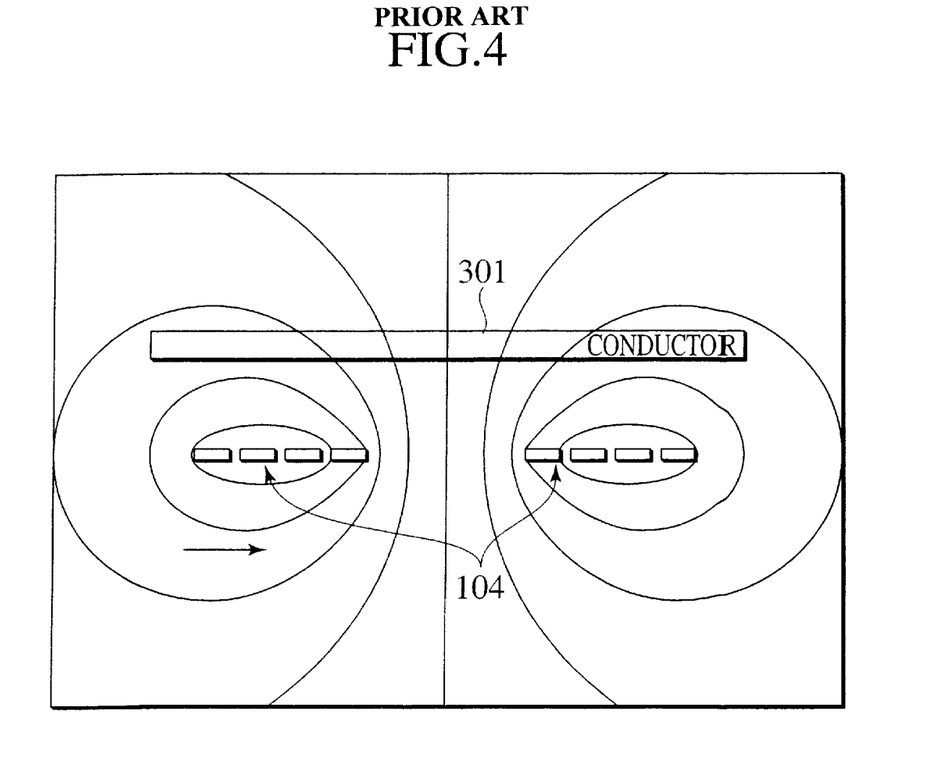
FIG. 4 shows equi-vector potential lines on the semiconductor chip of FIG. 3.

The problem of this semiconductor device will be explained. In FIG. 3, the spiral coil (inductance element) 104 is formed on the semiconductor chip 103. When current is passed, the coil 104 generates magnetic flux perpendicularly to the coil 104 as shown in FIG. 4 that shows equi-vector potential lines representing the magnetic flux. When the coil 104 is operated at a high frequency by passing high-frequency current through the coil 104, the direction of magnetic flux generated by the coil 104 changes at the current frequency. If a conductor 301 is arranged in the vicinity of the coil 104, the magnetic flux from the coil 104 generates eddy current in the conductor 301, to decrease the inductance of the coil 104.

In FIG. 2, the semiconductor chip 103 is mounted on the conductive bed 101, to form a standard semiconductor package. The distance between the coil 104 and the bed 101 is substantially equal to the thickness of the chip 103. Namely, the inductance element, i.e., the coil 104 is in the vicinity of a conductor, i.e., the bed 101 at the distance defined by the thickness of the chip 103.

Figure 5:
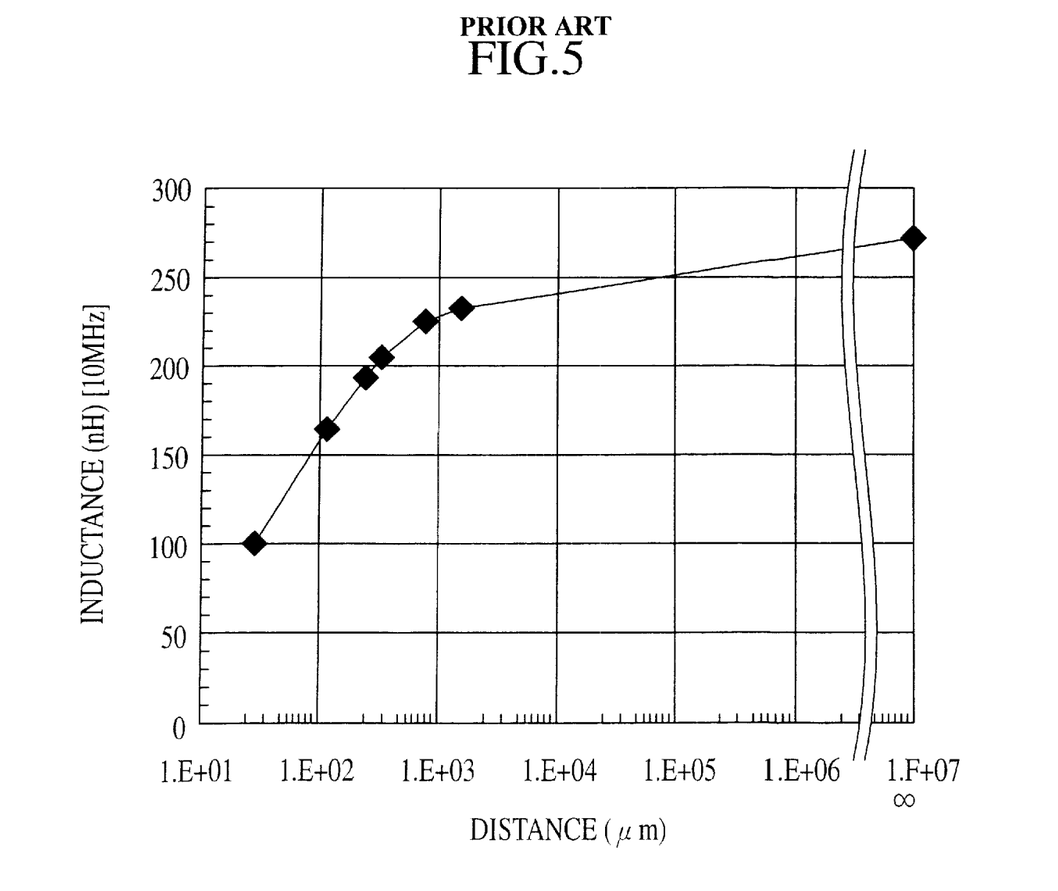
FIG. 5 is a graph showing a relationship between inductance provided by an inductance element and the distance of the inductance element from a Cu conductor.

FIG. 5 is a graph showing a relationship, between inductance provided by an inductance element operated at 10 MHz and the distance of the inductance element from a Cu conductor. The inductance element is a coil of 4000 μm in diameter, 80 μm in wire width, 80 μm in wire interval, 10 in turns, and 19 μm in thickness. The Cu conductor has a thickness of 0.15 mm. As the distance between the coil and the Cu conductor shortens, the inductance decreases. If the distance becomes 0.6 mm or shorter, the inductance decreases at the rate of the first power of the distance.

In FIG. 2, the bed 101 is a conductor and is close to the inductance element 104 at the distance defined by the thickness of the chip 103. This thickness is thin to deteriorate the inductance of the inductance element 104, as is apparent from FIG. 5. If the thickness of the chip 103 is 0.29 mm, a designed inductance value will decrease to 69%.

SUMMARY OF THE INVENTION

The present invention is to provide a semiconductor device capable of reducing eddy current produced in a bed and securing required inductance. A semiconductor device according to this invention includes a semiconductor chip, an inductance element of flat structure formed above a first surface of the semiconductor chip, and a magnetic material formed below a second surface of the semiconductor chip opposite to the first surface. The semiconductor device according to the present invention has a magnetic material formed on the semiconductor surface opposite to the inductance element.

DESCRIPTION OF THE PREFERRED EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 6:
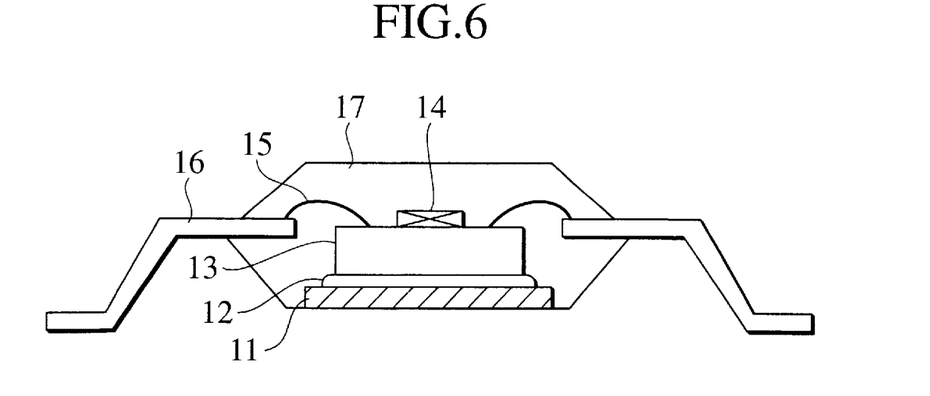
FIG. 6 is a sectional view showing a semiconductor device according to a first embodiment of the present invention.

FIG. 6 is a sectional view showing a semiconductor device according to the first embodiment of the present invention. This device is formed in a package and includes a semiconductor chip having a flat coil.

The coil 14 is formed on a top face of the chip 13, and a bottom face of the chip 13 is fixed to a conductive bed (frame) 11. The first embodiment is characterized by making the bed 11 from magnetic material.

Figure 7:
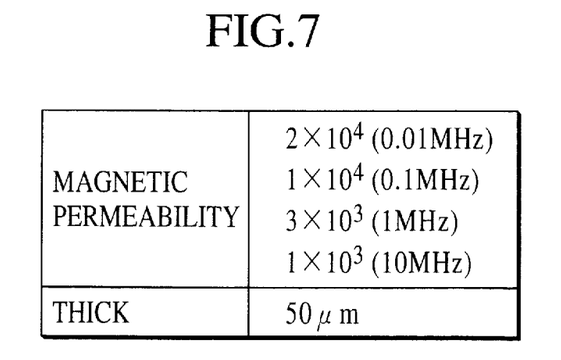
FIG. 7 shows exemplary specifications of a magnetic material 11 according to the first embodiment.

More precisely, the semiconductor device of the first embodiment has the bed 11, a mount 12 laid on a top face of the bed 11, and the semiconductor chip 13 fixed to the mount 12. Exemplary specifications of the bed 11 are shown in FIG. 7. The bed 11 is made by, for example, stamping a 50-$\mu$m amorphous ribbon made from, for example, (Co0.88Fe0.06Ni0.04Nb0.02)75Si10B15 by quenching. The magnetic material for making the bed 11 may be a crystalline metal-base soft magnetic material such as permalloy, a crystalline oxide-base soft magnetic material such as ferrite, an amorphous-base soft magnetic film such as a Co—Zr—Nb film, a nano-crystal soft magnetic film, or a hetero-amorphous soft magnetic film. Any other soft magnetic films are also employable. The magnetic bed 11 may have a thickness of 5 $\mu$m or greater to provide proper mechanical strength and pass sufficient magnetic flux. The thickness of the bed 11 may be 200 $\mu$m or thinner to reduce eddy current to be produced to an ignorable level.

Figure 8:
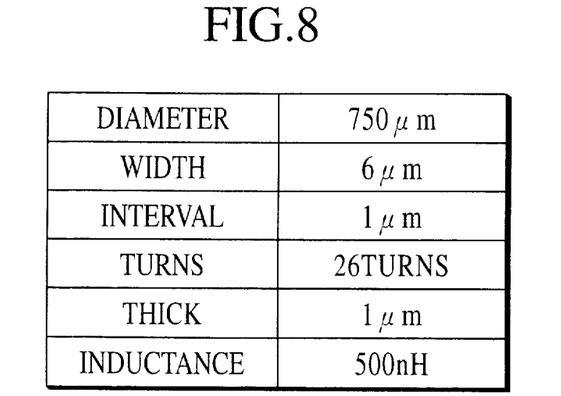
FIG. 8 shows exemplary specifications of an inductance element 14 according to the first embodiment.

A principal plane of the chip 13 is provided with the coil 14 serving as an inductance element. Exemplary specifications of the coil 14 are shown in FIG. 8. Although this embodiment provides the coil 14 with an outer diameter of 750 $\mu$m, the effect of the present invention is achievable if the coil 14 has an outer diameter of at least 10 $\mu$m. Although the number of turns of the coil 14 of this embodiment is 25, the effect of the present invention is achievable if the coil 14 has at least 3 turns.

The chip 13 has electrodes connected to leads 16 through bonding wires 15. The chip 13, leads 16, and bonding wires 15 are consolidated into a package with resin 17 by, for example, transfer molding.

Figure 9A:
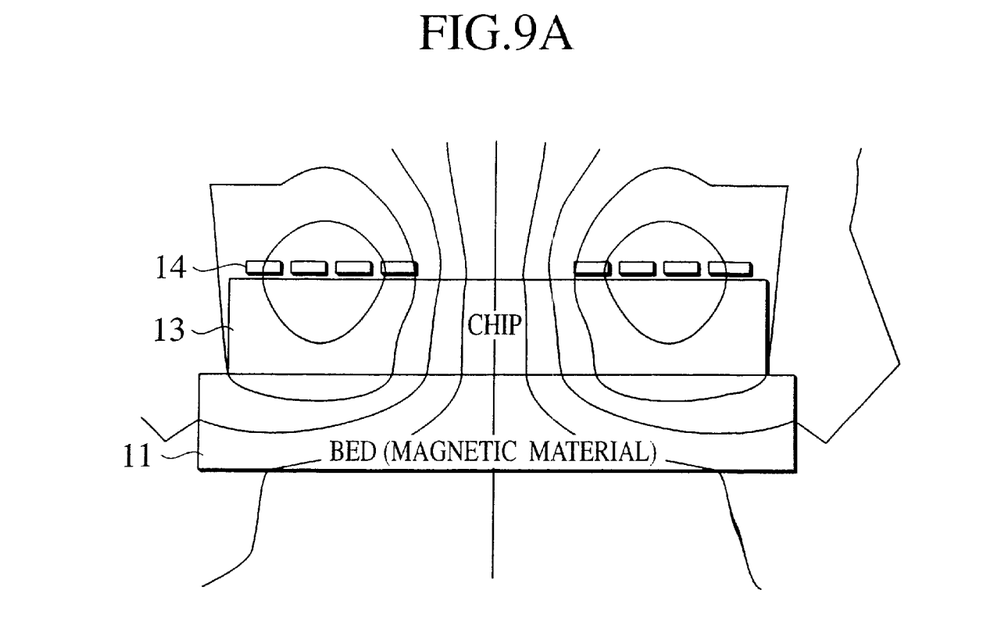
FIG. 9A is a model showing magnetic paths produced by the device of FIG. 6.
Figure 9B:
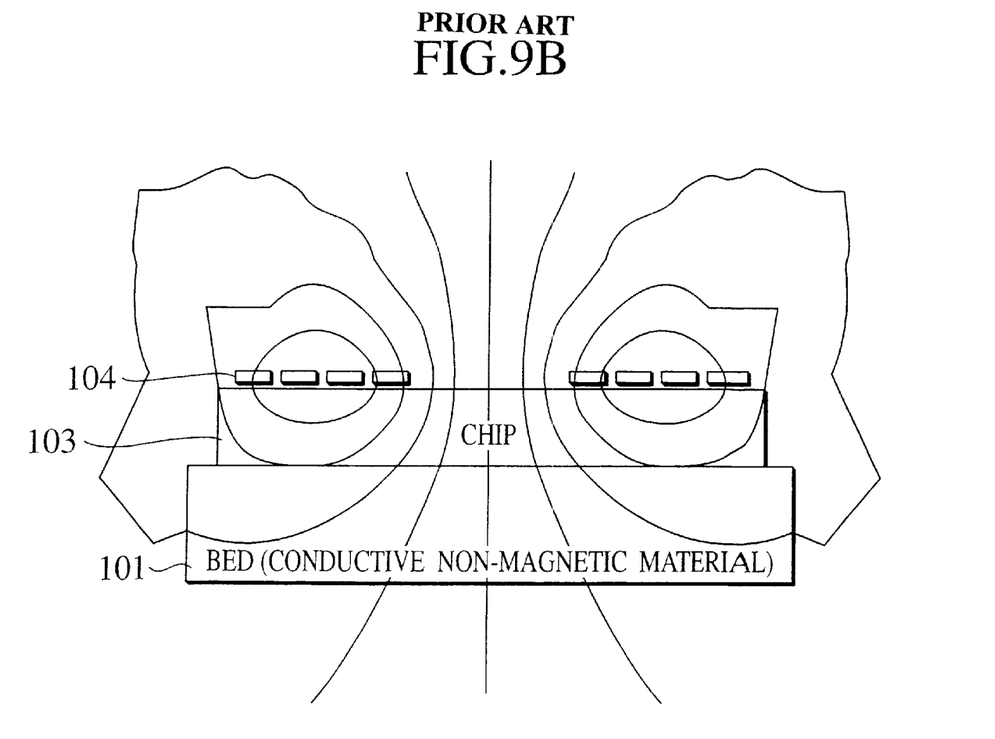
FIG. 9B is a model showing magnetic paths produced by the device of FIG. 2.

FIG. 9A is a model showing magnetic paths to be produced according to the first embodiment, and FIG. 9B is a model showing magnetic paths to be produced according to the related art of FIG. 2. Since the bed 11 of the first embodiment is made of magnetic material, magnetic flux produced by the inductance element (coil) 14 and passing through the bed 11 mostly runs in parallel with the bed 11, to reduce eddy current in the bed 11. This results in reducing an eddy current loss and securing the inductance of the inductance element 14.

Figure 10:
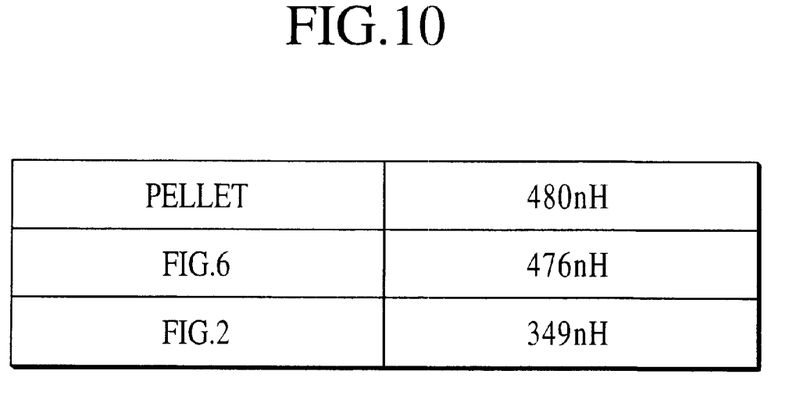
FIG. 10 shows inductance values at 10 MHz according to the first embodiment and the related art.

FIG. 10 shows inductance values at 10 MHz according to the first embodiment of FIG. 6 and the related art of FIG. 2. The inductance of the first embodiment employing a magnetic bed is 37% higher than that of the related art of FIG. 2 employing a nonmagnetic bed. The inductance of the first embodiment is lower than that of a pellet. This is due to an eddy current loss inside the magnetic bed 11. With respect to DC (Direct Current) or sufficiently low frequencies, employing a magnetic bed improves inductance by 7%.

Figure 11:
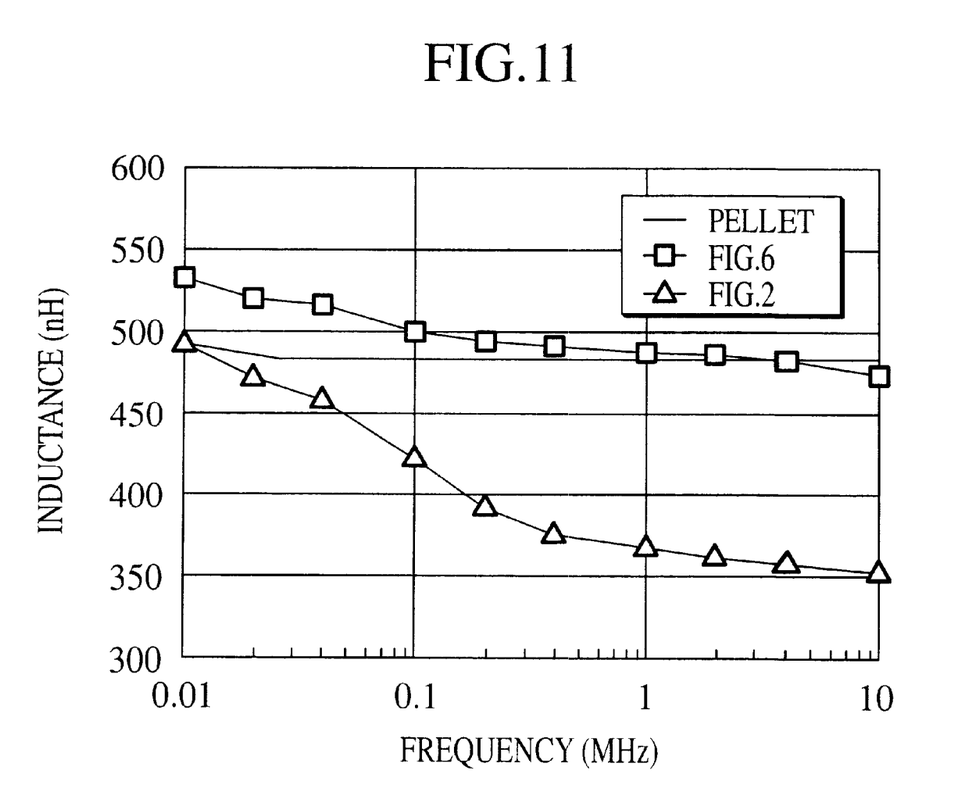
FIG. 11 is a graph showing inductance-frequency characteristics of the devices of FIGS. 2 and 6.

FIG. 11 is a graph showing inductance-frequency characteristics of the first embodiment of FIG. 6 and the related art of FIG. 2. The graph shows an inductance improvement in a low-frequency region due to a magnetic resistance reduction.

As explained above, a high-frequency coil formed on a semiconductor chip mounted on a nonmagnetic bed generates eddy current in the bed, to reduce an effective inductance value of the coil. To avoid this and secure inductance, the first embodiment of the present invention forms the bed 11 from magnetic material.

According to the first embodiment, the mount 12 for fixing the chip 13 to the bed 11 may be made of a magnetic-material-containing adhesive. Compared with a nonmagnetic mount, the magnetic mount 12 reduces eddy current in the mount 12, to further secure the inductance of the coil 14.

In this way, the first embodiment of the present invention fixes a semiconductor chip to a conductive bed (frame) made of magnetic material. Due to this, magnetic flux produced by an inductance element on the semiconductor chip and passing through the bed mostly runs in parallel with the bed, to reduce eddy current in the bed. This results in reducing an eddy current loss and securing the inductance of the inductance element. When the inductance element is operated at low frequencies, the inductance thereof increases due to a reduction in magnetic resistance.

The first embodiment may fix the semiconductor chip to the bed with a magnetic adhesive serving as a mount, to reduce an eddy current loss in the mount, to further secure the inductance of the inductance element.

Second Embodiment

Figure 12:
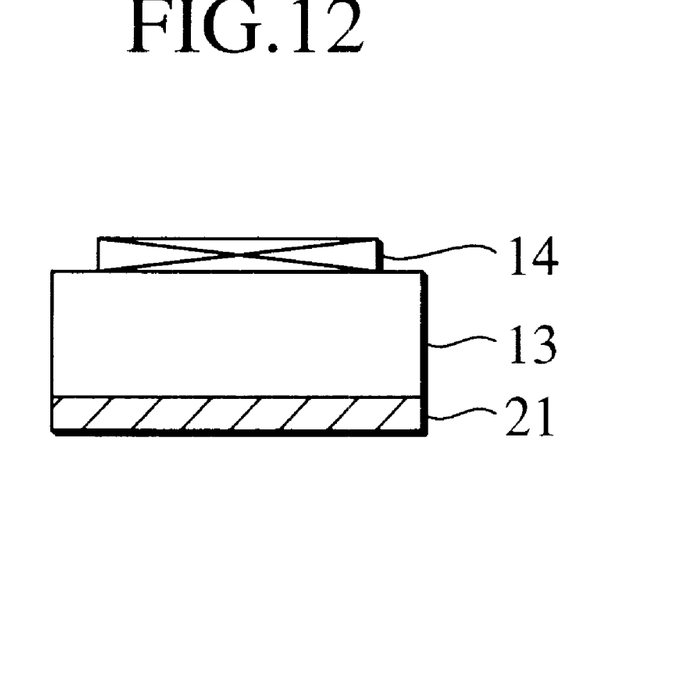
FIG. 12 is a sectional view showing a semiconductor device according to a second embodiment of the present invention.
Figure 13:
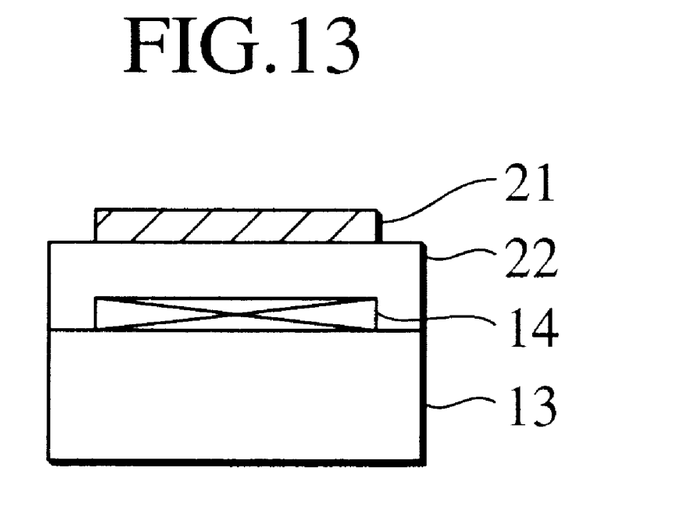
FIG. 13 is a sectional view showing a semiconductor device according to a modification of the second embodiment.

FIG. 12 is a sectional view showing a semiconductor device according to the second embodiment of the present invention. This device has a semiconductor chip 13, an inductance element 14 formed on a principal plane of the chip 13, and a magnetic layer 21 formed on a bottom face of the chip 13. FIG. 13 is a sectional view showing a semiconductor device according to a modification of the second embodiment. This device has a semiconductor chip 13, an inductance element 14 formed on a principal plane of the chip 13, a protective layer (passivation layer) 22 covering the inductance element 14, and a magnetic layer 21 formed on the protective layer 22.

Figure 14:
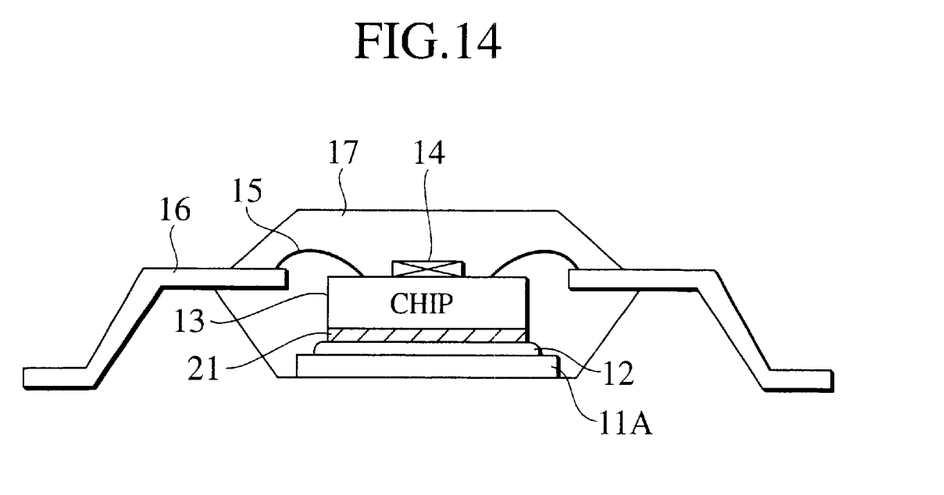
FIG. 14 is a sectional view showing a semiconductor device according to another modification of the second embodiment.
Figure 15:
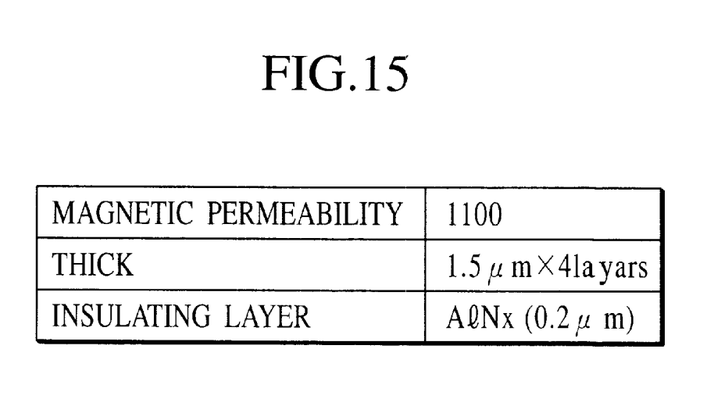
FIG. 15 shows exemplary specifications of a magnetic layer 21 according to the second embodiment.

FIG. 14 is a sectional view showing a semiconductor device according to another modification of the second embodiment. This device has a semiconductor chip 13 on which a flat coil 14 is formed. This modification employs a nonmagnetic conductor frame (bed) 11A and interposes a magnetic layer 21 between the chip 13 and the bed 11A. To realize this structure, chip areas are formed on a top face of a wafer, and a magnetic layer 21 is formed on a bottom face of the wafer by a gas-phase growing method such as spattering and vapor deposition, or by a wet method such as plating. The chip areas of the wafer are cut into chips by dicing, and each chip is mounted on a bed 11A with a mount 12. The magnetic layer 21 may be an FeCoBC film of four layers each of 1.5 $\mu$m thick. The magnetic material that forms the magnetic layer 21 may be a crystalline metal-base soft magnetic material such as permalloy, a crystalline oxide-base soft magnetic material such as ferrite, an amorphous-base soft magnetic film such as a Co—Zr—Nb film, a nano-crystal soft magnetic film, or a hetero-amorphous soft magnetic film. Any other soft magnetic films are also employable. FIG. 15 shows exemplary specifications of the magnetic layer 21.

Figure 16:
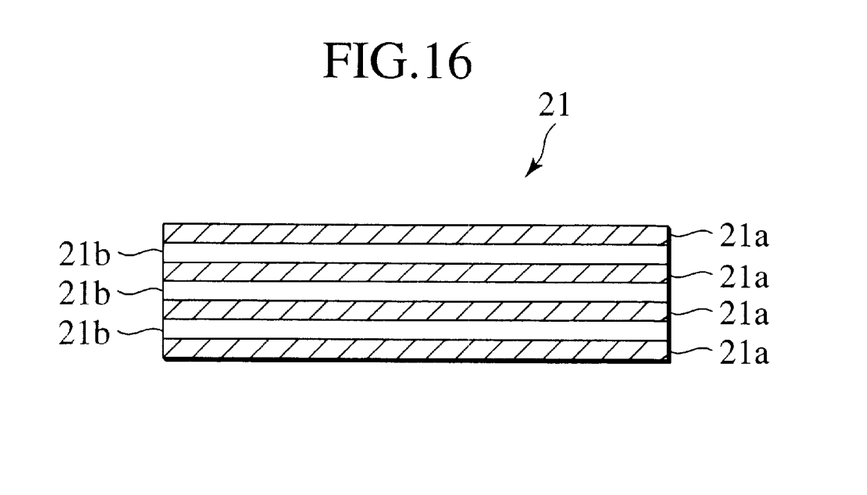
FIG. 16 is a sectional view showing an example of a magnetic layer 21 according to the second embodiment.

FIG. 16 is a sectional view showing an example of the magnetic layer 21. This example consists of magnetic layers 21a and insulating layers 21b that are alternated to form a layered structure. The layered structure is effective to reduce eddy current. The insulating layers 21b may be made of AlN, SiN, $SiO_2$, organic material, etc. The magnetic layers 21a may be made of crystalline metal-base soft magnetic material, crystalline oxide-base soft magnetic material, amorphous-base soft magnetic material, nano-crystal soft magnetic material, or hetero-amorphous soft magnetic material. In this embodiment, each layer is 1.5 $\mu$m thick. This thickness may be 5 $\mu$m or thinner.

Figure 17A:
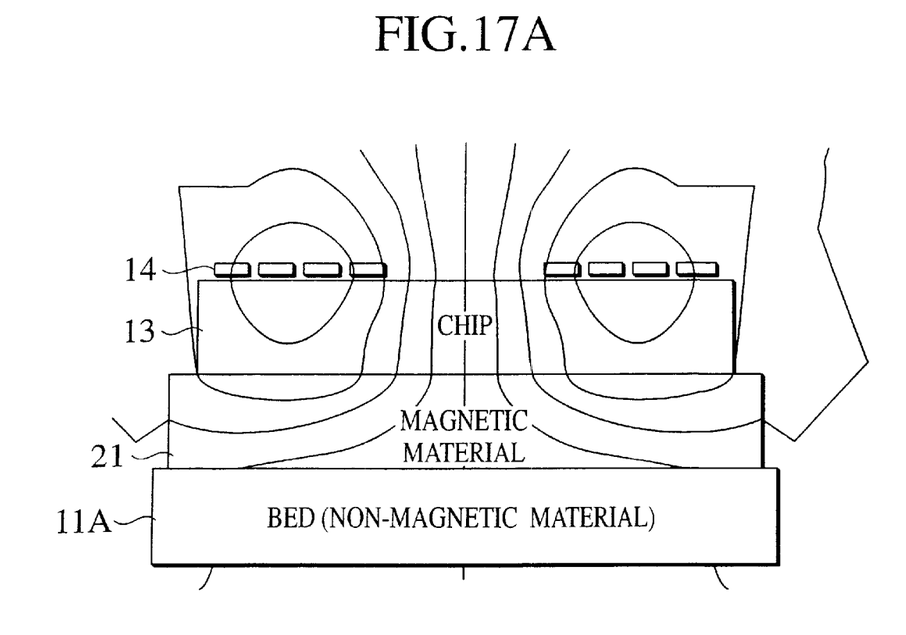
FIG. 17A is a model showing magnetic paths produced by the device of FIG. 14.
Figure 17B:
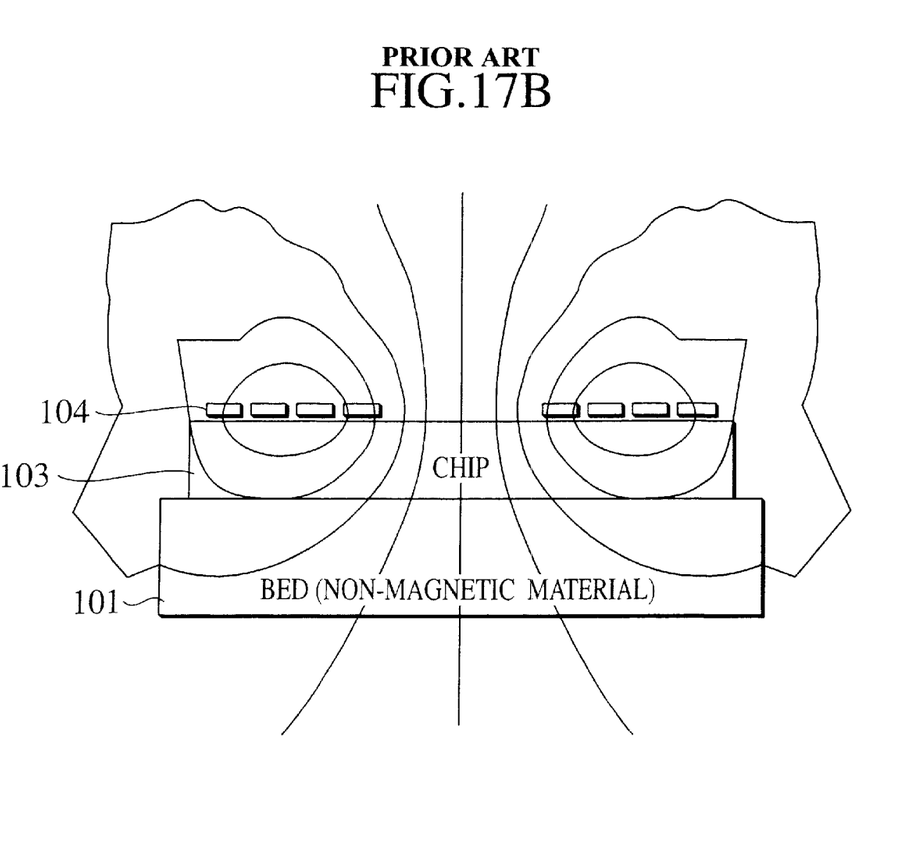
FIG. 17B is a model showing magnetic paths produced by the device of FIG. 2.

FIG. 17A is a model showing magnetic paths produced by the device of FIG. 14, and FIG. 17B is a model showing magnetic paths produced by the related art of FIG. 2. Due to the magnetic layer 21 interposed between the bed 11A and the semiconductor chip 13 according to the second embodiment, magnetic flux generated by the inductance element 14 and passing through the magnetic layer 21 mostly runs in parallel with the magnetic layer 21, to reduce eddy current in the magnetic layer 21. This results in reducing the absolute value of magnetic flux in the bed 11A and orienting the magnetic flux in parallel with the bed 11A, to reduce eddy current in the bed 11A, minimize an eddy current loss, and secure the inductance of the inductance element 14.

Figure 18:
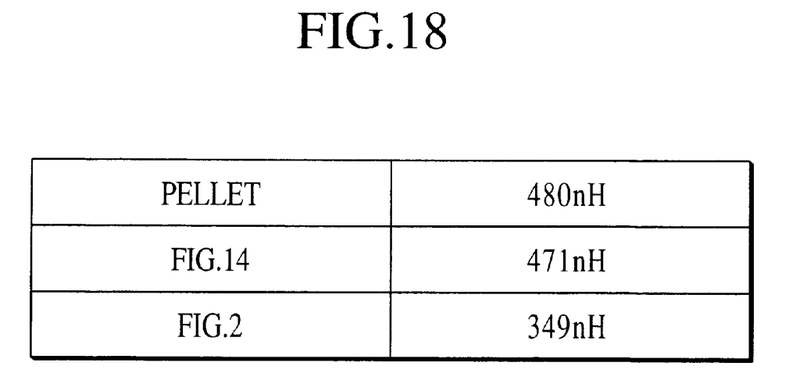
FIG. 18 shows inductance values at 10 MHz according to the second embodiment and the related art.

FIG. 18 shows inductance values at 10 MHz according to the second embodiment and the related art of FIG. 2. The figure shows that the inductance of the second embodiment is 35% higher than that of the related art of FIG. 2. The inductance of the second embodiment is smaller than that of a pellet. This is because of an eddy current loss in the magnetic layer 21 and an eddy current loss in the bed 11A caused by leakage magnetic flux from the bottom face of the magnetic layer 21. With respect to DC or sufficiently low frequencies, employing a magnetic layer on the bottom face of a semiconductor chip improves inductance by 7%.

Figure 19:
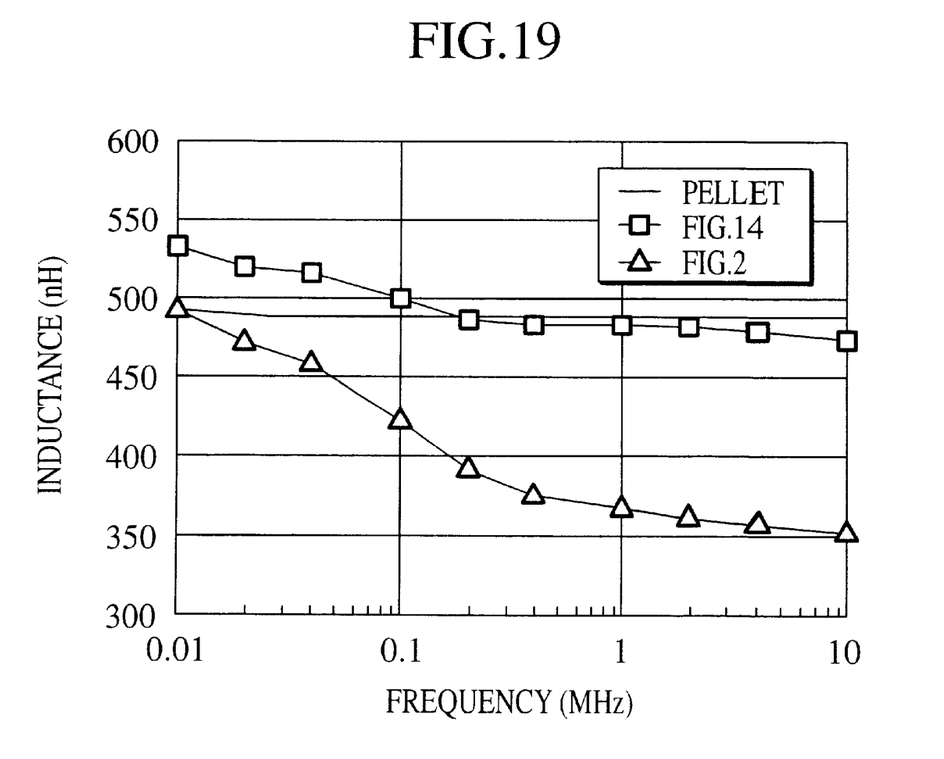
FIG. 19 is a graph showing inductance-frequency characteristics of the devices of FIGS. 2 and 14.

FIG. 19 is a graph showing inductance-frequency characteristics of the second embodiment and the related art of FIG. 2. The graph indicates an inductance improvement in a low-frequency region due to a magnetic resistance decrease. To manufacture the semiconductor device of the second embodiment, chip areas are formed on a top face of a wafer, and a magnetic layer 21 is formed on a bottom face of the wafer by a gas-phase growing method such as spattering and vapor deposition. The magnetic layer 21 may be formed by quenching and inserted into a bottom side of the chip. The magnetic layer 21 may be a magnetic mount for fixing the chip 13 to the bed 11A.

The mount 12 of FIG. 14 for fixing the bed 11A and magnetic layer 21 together may be a magnetic adhesive. Compared with a nonmagnetic mount, the magnetic mount 12 reduces an eddy current loss in the mount 12 to more effectively prevent an inductance loss.

In this way, the second embodiment interposes a magnetic layer between a semiconductor chip and a conductive frame (bed) to which the semiconductor chip is fixed. Due to this, magnetic flux generated by an inductance element on the semiconductor chip and passing through the bed mostly runs in parallel with the bed, to reduce eddy current in the bed. This results in reducing an eddy current loss and preventing an inductance loss of the inductance element. In low-frequency operation, the inductance of the inductance element increases due to a decrease in magnetic resistance.

The second embodiment may fix the bed 11A and magnetic layer 21 to each other with a magnetic adhesive. Compared with a nonmagnetic adhesive, the magnetic adhesive reduces an eddy current loss in the bed 11A and more effectively prevents an inductance loss of the inductance element 14.

Third Embodiment

Figure 20:
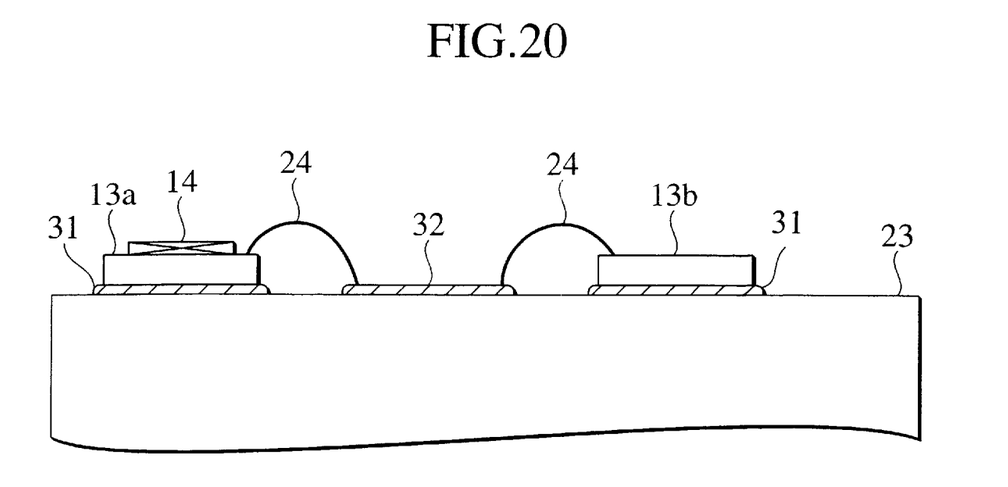
FIG. 20 is a sectional view showing a semiconductor device according to a third embodiment of the present invention.

FIG. 20 is a sectional view showing a semiconductor device according to the third embodiment of the present invention. This device has a substrate 23 and semiconductor chips 13a and 13b installed on the substrate 23. A magnetic conductor 31 is formed on the substrate 23, and the chip 13a is mounted on the magnetic conductor 31. The magnetic conductor 31 may contain Cu, Au, or Al. The chip 13a is electrically connected to a wiring pattern 32 through a bonding wire 24. The wiring pattern 32 is connected to the chip 13b through a bonding wire 24. The magnetic conductor 31 may be a magnetic wiring pattern formed on the substrate 23.

Figure 21:
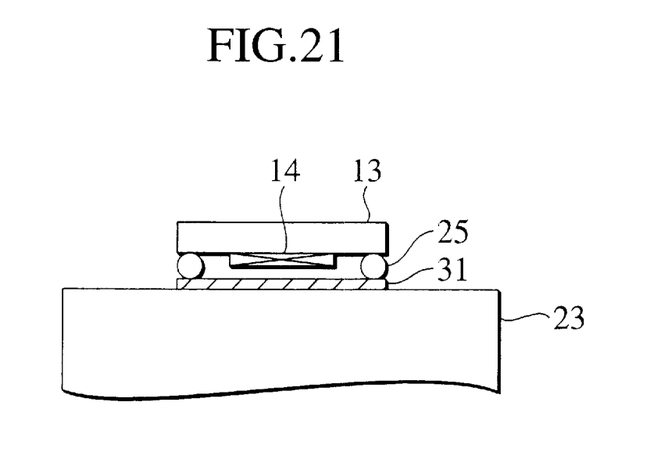
FIG. 21 is a sectional view showing a semiconductor device according to a modification of the third embodiment.

FIG. 21 is a sectional view showing a semiconductor device according to a modification of the third embodiment. This device has a substrate 23 and a semiconductor chip 13 mounted on the substrate 23. A magnetic conductor 31 is formed on the substrate 23, and the chip 13 is mounted on the magnetic conductor 31. The magnetic conductor 31 may contain Cu, Au, or Al. The magnetic conductor 31 may be a magnetic wiring pattern. The chip 13 is electrically connected to the magnetic conductor 31 through solder balls 25. If the solder balls 25 provide a sufficient space between the chip 13 and the substrate 23, an inductance element 14 may be formed on a bottom face of the chip 13 in the space defined by the solder balls 25. The inductance element 14 may be formed on a top face of the chip 13.

In this way, the third embodiment forms a magnetic wiring pattern directly on a substrate. Namely, the third embodiment employs a standard semiconductor chip and forms a magnetic material on a substrate on which the chip is mounted. This eliminates a need of separately forming a magnetic material on the semiconductor chip.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device comprising:

a semiconductor chip;

an inductance element of flat structure formed above a first surface of the semiconductor chip;

a magnetic material formed below a second surface of the semiconductor chip opposite to the first surface; and a resin covering the semiconductor chip, the inductance element, and the magnetic material.

2. The semiconductor device as claimed in claim 1, wherein:

the magnetic material serves as a bed of a package structure encapsulating the semiconductor chip.

3. The semiconductor device as claimed in claim 2, wherein:

the magnetic material is between 5 $\mu$m and 200 $\mu$m in thickness.

4. The semiconductor device as claimed in claim 2, wherein:

the magnetic material includes a film of soft magnetic material.

5. The semiconductor device as claimed in claim 4, wherein:

the magnetic material is one of a crystalline metal-base soft magnetic material, a crystalline oxide-base soft magnetic material, an amorphous-base soft magnetic film, a nano-crystal soft magnetic film, and a hetero-amorphous soft magnetic film.

6. The semiconductor device as claimed in claim 4, wherein:

the magnetic material is made by stamping an amorphous ribbon.

7. The semiconductor device as claimed in claim 1, wherein:

the magnetic material includes a magnetic-material-containing adhesive.

8. The semiconductor device as claimed in claim 1, further comprising:

a mount arranged on a surface of the magnetic material and supporting the semiconductor chip;

a bonding wire connected to an electrode of the semiconductor chip;

a lead connected to the bonding wire, wherein the resin packages the semiconductor chip, the inductance element, the magnetic material, the bonding, wire, and part of the lead.

9. The semiconductor device as claimed in claim 8, wherein:

the mount includes a magnetic-material-containing adhesive.

10. The semiconductor device as claimed in claim 1, wherein the magnetic material comprises:

magnetic layers; and nonmagnetic layers alternated with the magnetic layers, to form a layered structure.

11. The semiconductor device as claimed in claim 10, wherein:

the magnetic layers are made of one of crystalline metal-base soft magnetic material, crystalline oxide-base soft magnetic material, amorphous-base soft magnetic material, nano-crystal soft magnetic material, and hetero-amorphous soft magnetic material.

12. The semiconductor device as claimed in claim 10, wherein:

the magnetic layers and nonmagnetic layers are each 5 $\mu$m or thinner in thickness.

13. The semiconductor device as claimed in claim 10, wherein:

the nonmagnetic layers are made of one of AlN, SiN, $SiO_2$, and organic material.

14. The semiconductor device as claim in claim 1, wherein:

the magnetic material is formed on a bottom surface of the semiconductor chip.

15. The semiconductor device as claimed in claim 14, wherein:

the magnetic material is formed by one of spattering, vapor deposition, and gas-phase growing.

16. The semiconductor device as claimed in claim 1, wherein:

the magnetic material is a thin magnetic film formed by quenching.

17. A semiconductor device comprising:

a semiconductor chip;

an inductance element of flat structure formed above a surface of the semiconductor chip;

a passivation film covering the inductance element;

a magnetic material arranged on the passivation film; and a resin covering the semiconductor chip, the inductance element, the passivation film, and the magnetic material.

18. A semiconductor device comprising:

a substrate;

a magnetic-material-containing wiring pattern formed on a surface of the substrate;

a semiconductor chip arranged on the wiring pattern; and an inductance element of flat structure formed above a surface of the semiconductor chip.

19. The semiconductor device as claimed in claim 18, wherein:

the semiconductor chip has solder balls that are electrically connected to the wiring pattern.

20. The semiconductor device as claimed in claim 19, wherein:

the surface of the semiconductor chip on which the inductance element is formed on the wiring pattern side.

* * * * *